(12) United States Patent
Shimeno et al.

(10) Patent No.: US 6,318,944 B1
(45) Date of Patent: *Nov. 20, 2001

(54) SEMICONDUCTOR FABRICATING APPARATUS, METHOD FOR MODIFYING POSITIONAL DISPLACEMENT OF A WAFER IN A WAFER CASSETTE WITHIN THE SEMICONDUCTOR FABRICATING APPARATUS AND METHOD FOR TRANSFERRING THE WAFER CASSETTE

(75) Inventors: Kazuhiro Shimeno; Kouji Tometsuka; Shigeo Ohba, all of Tokyo (JP)

(73) Assignee: Kokusai Electric Co., Ltd. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/659,021

(22) Filed: Jun. 4, 1996

(30) Foreign Application Priority Data

Jun. 15, 1995 (JP) ................................................. 7-172742
Apr. 30, 1996 (JP) ................................................. 8-132864

(51) Int. Cl.⁷ ..................................................... G01P 13/00
(52) U.S. Cl. ...................... 414/172; 454/187; 432/239; 118/719; 414/217; 414/416.08; 414/937; 414/939; 414/940; 414/936; 414/754; 414/283; 414/416.03
(58) Field of Search ............................. 118/719; 432/239; 414/172, 935, 936, 939, 940, 937, 217, 773, 754, 277, 280, 281, 283, 416.08, 416.03, 416.01, 222.01

(56) References Cited

U.S. PATENT DOCUMENTS

| | | | | |
|---|---|---|---|---|
| 5,064,337 | * | 11/1991 | Asakawa et al. | 414/940 X |
| 5,464,313 | * | 11/1995 | Ohsawa | 414/172 |
| 5,468,112 | * | 11/1995 | Ishii et al. | 414/940 X |
| 5,562,383 | * | 10/1996 | Iwai et al. | 414/940 X |

FOREIGN PATENT DOCUMENTS

294410 * 11/1993 (JP) ...................................... 414/940

* cited by examiner

Primary Examiner—Frank E. Werner
(74) Attorney, Agent, or Firm—Morrison & Foerster LLP (57) ABSTRACT

A semiconductor fabricating apparatus having a vertical reaction furnace, a boat for holding plural wafers in a multi-layered fashion and being loaded into the vertical reaction furnace, a storage disposed at a location corresponding to the boat for storing at least one of the wafer cassettes, a wafer transfer device for transferring the wafer between the storage and the boat, a cassette transfer unit for transferring the wafer cassettes between the apparatus and outside thereof, a cassette transfer device for effecting the transfer of the wafer cassettes between the cassette transfer unit and the storage, and a plurality of cassette shelves disposed within a range allowing transfer of the wafer cassettes from the cassette transfer device for receiving the wafer cassettes in upwardly-oriented positions. With the apparatus thus arranged, it becomes possible to modify the positional displacement of the wafer relative to the wafer cassettes since the wafer cassettes can be transported on to the cassette shelves in upwardly-oriented positions.

10 Claims, 7 Drawing Sheets

SEMICONDUCTOR FABRICATING APPARATUS, METHOD FOR MODIFYING POSITIONAL DISPLACEMENT OF A WAFER IN A WAFER CASSETTE WITHIN THE SEMICONDUCTOR FABRICATING APPARATUS AND METHOD FOR TRANSFERRING THE WAFER CASSETTE

TECHNICAL BACKGROUND

The present invention relates to a semiconductor fabricating apparatus for producing a semiconductor device by depositing a thin film on a silicon wafer or by subjecting the latter to an impurity diffusion treatment, etc., to a method for modifying the positional displacement of a wafer in a wafercassette within the semiconductor fabricating apparatus, and to a method for transferring the wafer cassette.

Figure 9:
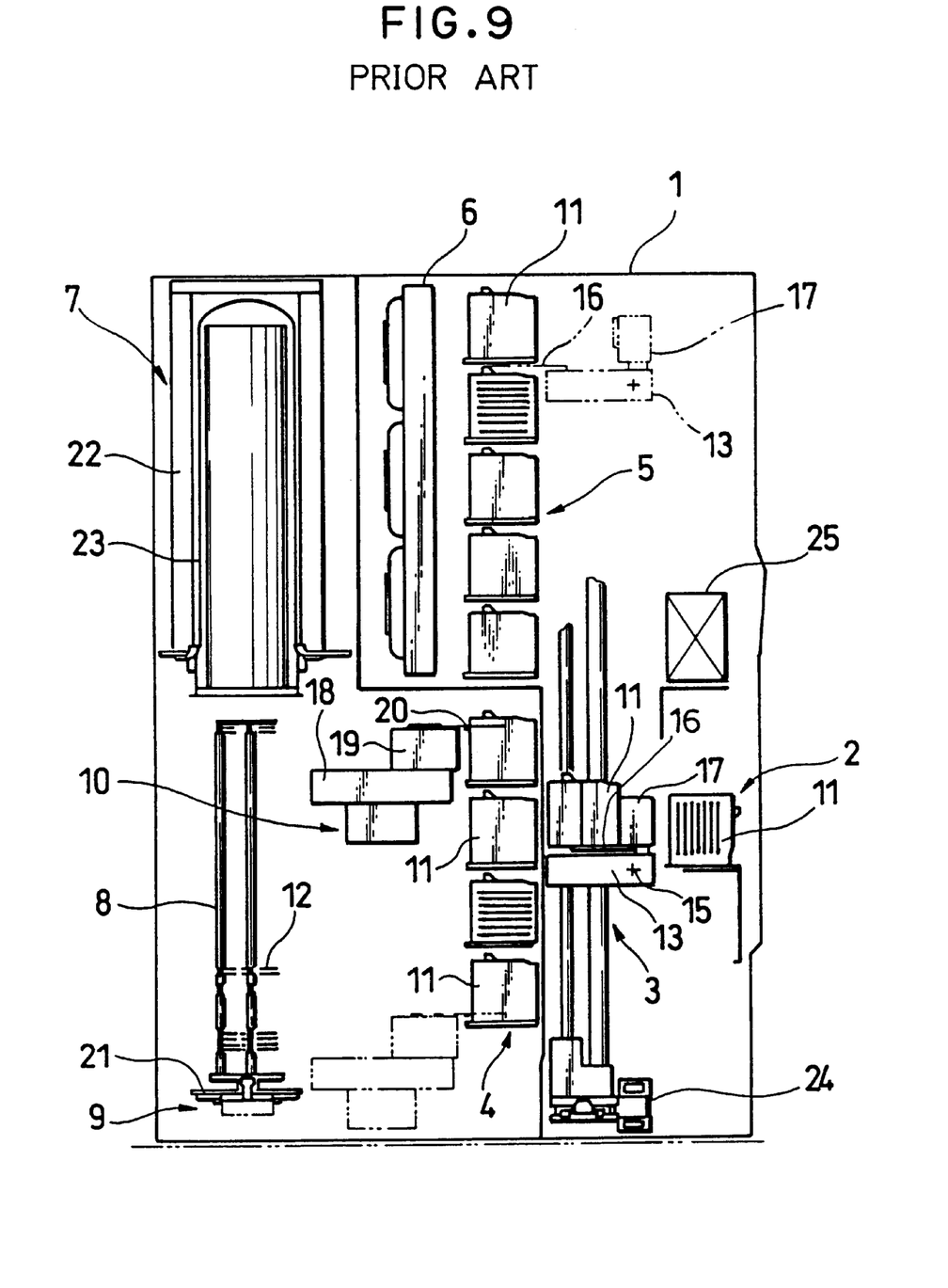
FIG. 9 is a schematic side elevational view illustrating a conventional semiconductor fabricating apparatus.
Figure 10:
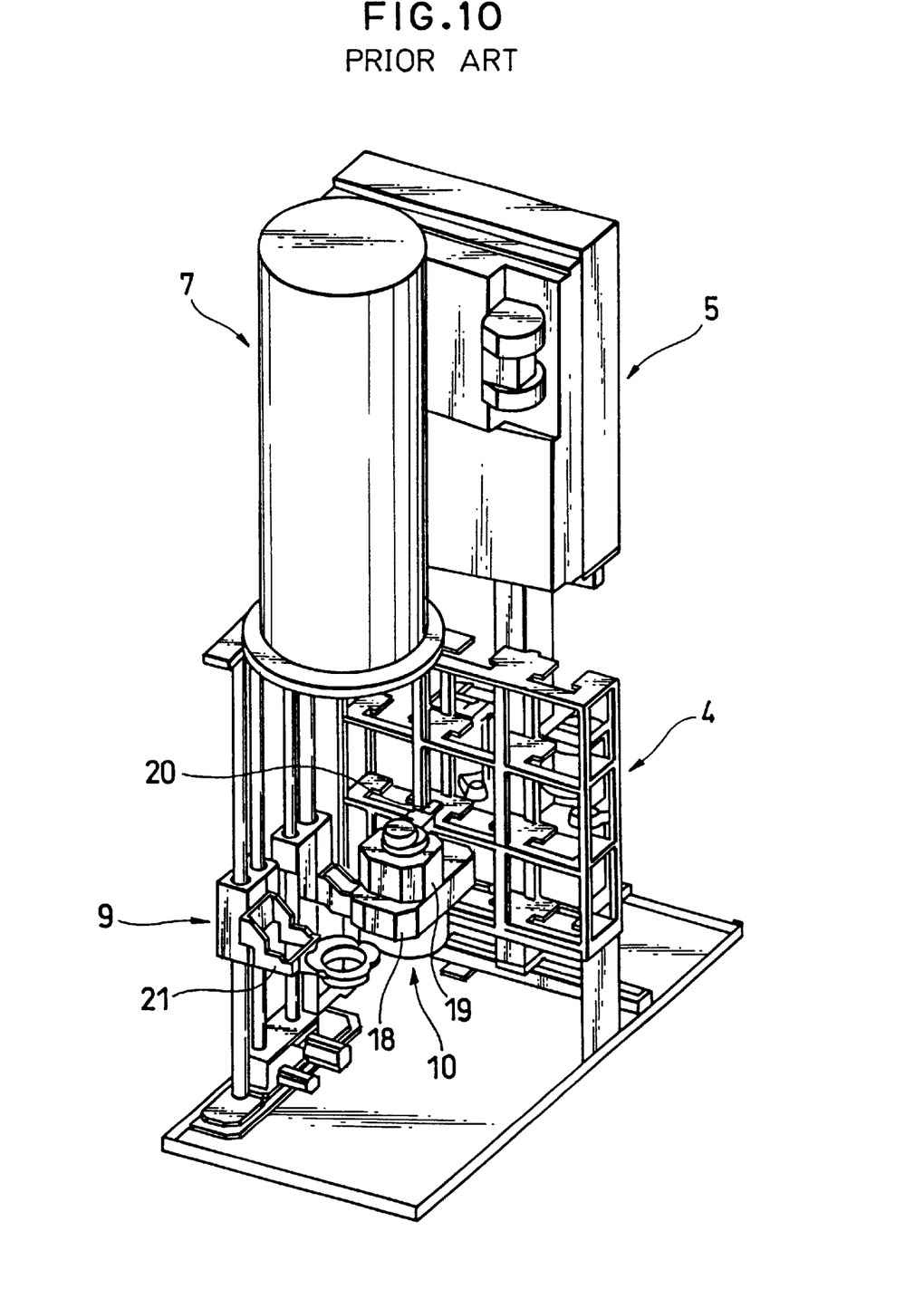
FIG. 10 is a perspective view of the conventional apparatus as seen from a rear side thereof.

Referring to FIGS. 9 and 10, a conventional semiconductor fabricating apparatus will now be described.

The apparatus includes a housing 1 in which a cassette transfer unit 2 is provided at a front side thereof for achieving the transfer of a wafer cassette 11 between the apparatus and an external transfer system. Behind the cassette transfer unit 2, there is provided a cassette transfer device 3. Provided behind the cassette transfer device 3 is a cassette storage 4. A buffer storage 5 is disposed upwardly of the cassette storage 4. Behind the buffer storage 5, there is provided a clean unit 6. Disposed at a rear upper part of the housing 1 is a vertical reaction furnace 7. Below the reaction furnace 7, there is provided a boat elevator 9 for introducing into and withdrawing from the furnace 7 a boat 8. Between the boat elevator 9 and the cassette storage 4, there is provided a wafer transfer device 10. Reference numeral 25 designates a clean unit.

The cassette transfer device 3 is supported on a drive portion 24 which can move upward, downward and in a horizontal direction. The cassette transfer device 3 includes a cassette loader 13 which is designed to rotate about a horizontal axial center 15 by approximately 90°. The cassette loader 13 also includes a cassette transfer plate 16 capable of back and forth movements and a cassette receiver 17 disposed perpendicularly to the cassette transfer plate 16.

Each of the cassette storage 4 and the buffer storage 5 has plural rows of cassette shelves (three rows of three shelves shown in the figures) . The number of the shelves is at least greater than the number of wafer cassettes required for single batch processing.

The wafer transfer device 10 comprises a rotary stage 18 which can move upward and downward and rotate and a wafer chuck 19 capable of advancing and retracting movements mounted on the rotary stage 18. The wafer chuck 19 includes plural chuck plates 20 arranged vertically.

The boat elevator 9 includes a boat receiver plate 21 which can move upward and downward for supporting the boat 8 thereon.

The reaction furnace 7 is comprised of a cylindrical heater 22 and a reaction tube 23 located internally of the heater 22 and forming a reaction chamber which is sealingly closed by the full insertion of the boat 8.

The wafer cassette 11 loading wafers 12 is transferred from the external transfer system to the cassette transfer unit 2 in an upwardly-oriented position. Then, the transferred wafer cassette 11 is held by the cassette transfer device 3 and transferred from the cassette transfer unit 2 to the cassette storage 4 after it is rotated by 90° to be brought to a horizontal position.

The wafer transfer device 10 effects the transfer of the wafers 12 between the cassette storage 4 and the boat 8.

By the upward and downward movements and rotation of the rotary stage 18, the wafer chuck 19 is brought to oppose the wafer cassette 11 to be transferred. Then, by the forward and backward movements of the wafer chuck 19, the wafers 12 are chucked by the chuck plate 20. Thereafter, the chucked wafers 12 are sequentially loaded onto the boat 8 through the upward and downward movements and rotation of the rotary stage 18 and the forward and backward movements of the wafer chuck 19. Within a predetermined range at the upper and lower portions of the boat 8, there are provided dummy wafers as well as monitor wafers at predetermined intervals.

When the loading of the wafers onto the boat 8 is completed, the boat elevator 9 introduces the boat 8 into the reaction furnace 7 for treatment of the wafers.

The treated wafers are loaded back onto the wafer cassette backwardly following the wafer cassette transfer procedure described above, whereafter the wafer cassette is taken out again following backwardly the wafer cassette transfer procedure. The dummy wafers are used repeatedly. Thus, no transfer operations are conducted with respect to the dummy wafers when the semiconductor fabricating apparatus is in operation.

In the described conventional semiconductor fabricating apparatus, the cassette storage 4 and the buffer storage 5 are both arranged to accommodate the wafer cassettes 11 in horizontally-oriented positions.

Further, as described above, the dummy wafers are used repeatedly within the semiconductor fabricating apparatus and thus undergo repeated transfer operations between the boat 8 and the wafer cassettes in the cassette storage 4. As a result, it is likely that the dummy wafers are positionally displaced with respect to the wafer cassette 11 due to transfer errors and vibrations to occur during transfer of the wafers 12. Such positional displacement of the dummy wafers may accumulates and exceed the tolerable level.

If such positional displacement of the wafers exceeds the tolerable level, such troubles as impossibility of wafer transfer, damaging of the wafers and down-fall of the boat may result. This may further lead to the stoppage of the apparatus, thus lowering the serviceability ratio of the apparatus. Apart from this, since cleanliness within the semiconductor fabricating apparatus significantly affects the treatment quality of the wafers, improved cleanliness within the apparatus has been desired.

SUMMARY OF THE INVENTION

It is therefore an object of the present invention to provide a semiconductor fabricating apparatus wherein the positional displacement of dummy wafers relative to wafer cassettes, which results from the repeated use of the dummy wafers, is prevented by modifying such displacement at a predetermined time to thereby avoid such accidents as failures to transfer wafers and dummy wafers, damaging of the wafers and down-fall of boats and hence to increase the rate of operation of the apparatus. Another object of the present invention is to provide a semiconductor fabricating apparatus wherein a cassette storage and a buffer storage have increased accommodation capacity. Still another object of the present invention is to provide a semiconductor fabricating apparatus in which a stream of uniform clean air flows through the apparatus to prevent inside air from remaining therein, whereby cleanliness within the apparatus is improved. According one aspect of the present invention, there is provided a semiconductor fabricating apparatus which comprises a plurality of cassette shelves capable of loading wafer cassettes in upwardly-oriented positions. In a preferred form of the invention, the semiconductor fabricating apparatus further comprises a cassette transfer unit, a cassette transfer device and a storage in order seen from the front side of an internal of a housing, wherein the cassette shelves capable of loading wafer cassettes in upwardly-oriented positions are provided upwardly of the cassette transfer unit. According to another aspect of the present invention, there is provided a semiconductor fabricating apparatus comprising a vertical reaction furnace, a boat for holding plural wafers in a multi-layered fashion and being loaded into the vertical reaction furnace, a storage disposed at a location corresponding to the boat for storing at least one of the wafer cassettes, a wafer transfer device for transferring the wafer between the storage and the boat, a cassette transfer unit for transferring the wafer cassettes between the apparatus and outside thereof, a cassette transfer device for transferring the wafer cassettes between the cassette transfer unit and the storage, and a plurality of cassette shelves disposed within a range allowing transfer of the wafer cassettes from the cassette transfer device for receiving the wafer cassettes in upwardly-oriented positions. Preferably, the cassette transfer device includes a cassette loader capable of changing the positions of the wafer cassettes. The cassette transfer device may include a cassette loader capable of transferring the wafer cassettes in inclined positions. Parts of the storage may form cassette shelves capable of receiving the wafer cassettes in upwardly-oriented positions. The storage may be comprised of a cassette storage and a buffer storage disposed above the cassette storage, and at least a part of at least one of the cassette storage and the buffer storage may form one of cassette shelves capable of receiving the wafer cassettes in upwardly-oriented positions. In another form, the storage may be comprised of a cassette storage and a buffer storage disposed above the cassette storage, and the apparatus may further comprise a clean unit provided in opposed relations with the buffer storage for forming a flow of clean air passing through the buffer storage, and cassette shelves provided above the cassette transfer unit and located downstream of the clean air flow. According to a further aspect of the present invention, there is provided a method for modifying the positional displacement of a wafer within wafer cassettes in a semiconductor fabricating apparatus including at least a storage for accommodating the wafer cassettes, a cassette transfer unit for transferring the wafer cassettes between the apparatus and outside thereof, and a cassette transfer device for transferring the wafer cassettes between the cassette transfer unit and the storage, the cassette transfer device having a cassette loader capable of changing the positions of the wafer cassettes, the method comprising the step of retaining the wafer cassettes in upwardly-oriented positions to thereby modify the positional displacement of the wafer relative to the wafer cassettes. In a preferred form, the method further comprises the steps of taking the wafer cassettes out from the storage by means of the cassette transfer device, bringing the wafer cassettes into upwardly-oriented positions, and thereafter returning the wafer cassettes to the storage. According to a still further aspect of the present invention, there is provided a method for transferring wafer cassettes in a semiconductor fabricating apparatus including at least a storage for accommodating the wafer cassettes, a cassette transfer unit for transferring the wafer cassettes between the apparatus and outside thereof, and a cassette transfer device for transporting the wafer cassettes between the cassette transfer unit and the storage, the method comprising the step of inclining the wafer cassettes as the latter are transported by the cassette transfer device.

The above and further objects, details and advantages of the present invention will become apparent from the following detailed description of preferred embodiments thereof, when read in conjunction with the accompanying drawings.

DETAILED DESCRIPTION OF THE PREFERRED EMBODIMENTS

Preferred embodiments of the present invention will hereinafter be described in more detail with reference to the accompanying drawings.

Figure 1:
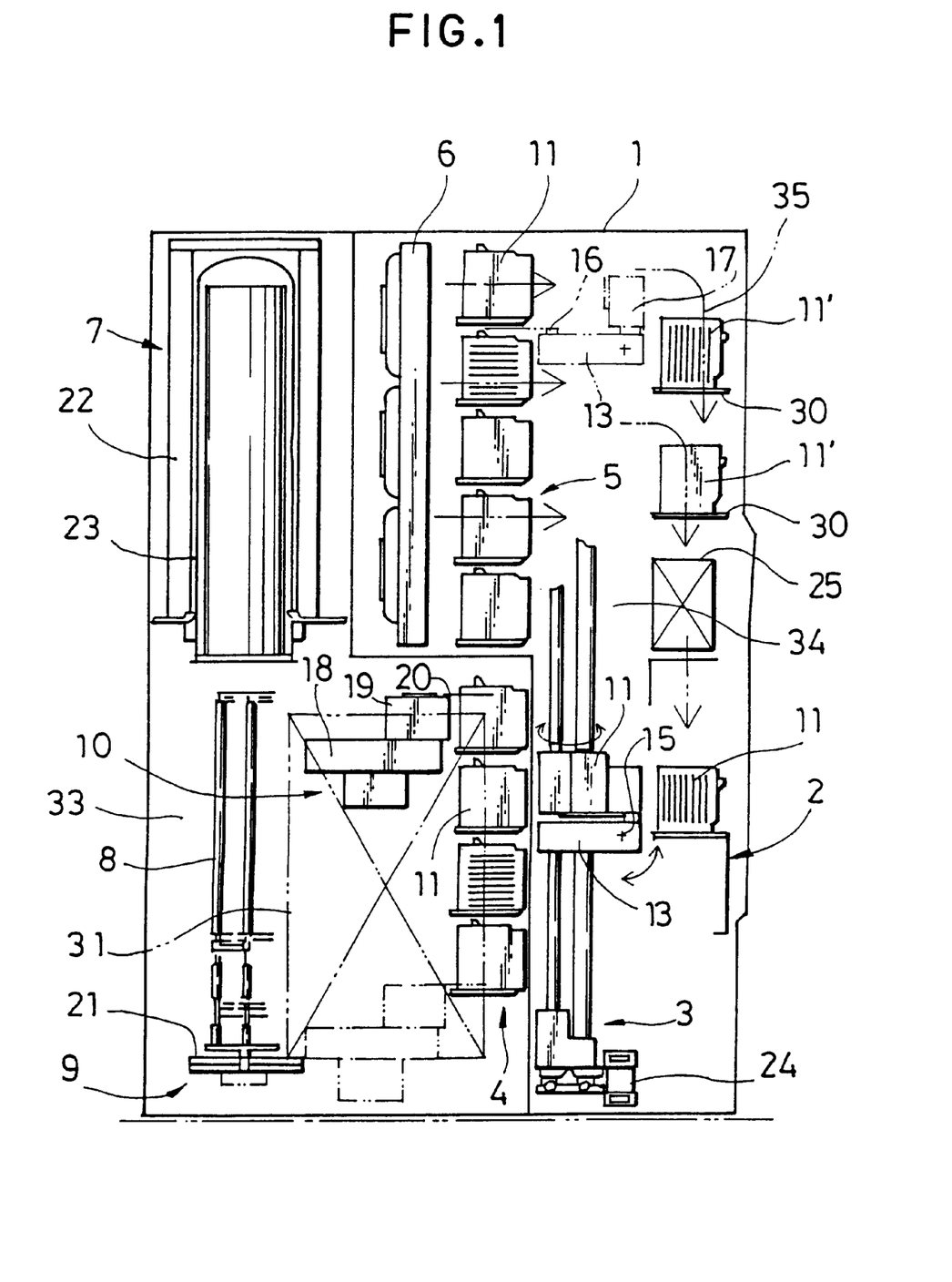
FIG. 1 is a schematic side elevational view of a preferred embodiment according to the present invention.

In FIG. 1, same reference numerals will be used for corresponding parts as shown in FIG. 9, and their description will be omitted.

Above the clean unit 25, there are provided predetermined rows of preliminary cassette shelves 30 in confronting relations with the buffer storage 5, which amount at least to the number of the wafer cassettes with the dummy wafers loaded thereon. The preliminary cassette shelves 30 are constructed to allow loading of the wafer cassettes 11 in upwardly-oriented positions. The preliminary cassette shelves 30 may be provided more than the wafer cassettes for the dummy wafers so that wafer cassette storage capacity within the semiconductor fabricating apparatus can be increased.

On at least the cassette shelves of the row of the cassette storage 4 to which the wafer transfer device 10 accesses, the wafer cassettes are accommodated in upwardly-oriented positions. Accordingly, with regard to the cassette shelves of the rows other than the row to which the wafer transfer device 10 accesses, the wafer cassettes can be accommodated in upwardly-oriented positions for the purpose of modifying the positional displacement of the wafers with respect to the wafer cassettes. The cassette transfer device 3 is capable of transferring the wafer cassettes without changing their postures or positions and, though not shown in the figure, has also a mechanism designed to rotate about a vertical axial center in a horizontal plane by 180°. The wafer cassettes accommodated in upwardly-oriented positions are brought into horizontal postures during their transfer operations by the cassette transfer device 3.

The housing 1 has a clean unit 31 at a side thereof which purifies air aspirated from outside of the housing 1 and forming a flow of clean air in a horizontal direction.

Referring to FIGS. 4–8, description will now be made as to the transfer operations of the cassette transfer device 3 from the cassette transfer unit 2 to the cassette storage 4 and then to the buffer storage 5. Since the transfer operation to the cassette storage 4 is the same as the transfer operation to the buffer storage 5, only the transfer operation to the cassette storage 4 will be explained hereinbelow.

The wafer cassettes 11 are upwardly oriented as they are placed on the wafer transfer unit 2. The cassette loader 13 is rotated about the horizontal axial center 15 by 90° to cause the cassette receiver 17 to enter the underside of the cassette transfer unit 2 (FIG. 4(A) and FIG. 4(b)). Then, the cassette receiver 17 is caused to advance with respect to the cassette loader 13 (FIG. 5(A)), whereafter the cassette loader 13 is caused to ascend.

Figure 5A:
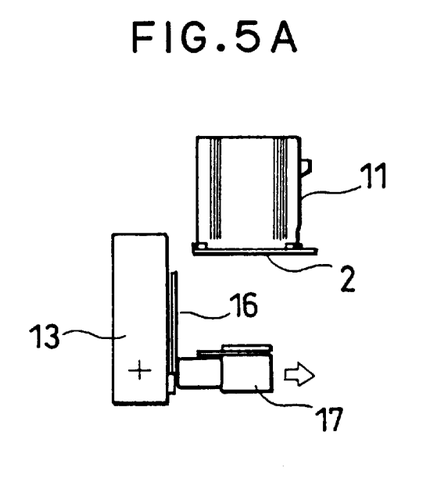
FIG. 5(A) and FIG. 5(B) are views showing part of the wafer cassette transfer operation carried out according to the preferred embodiments.
Figure 5B:
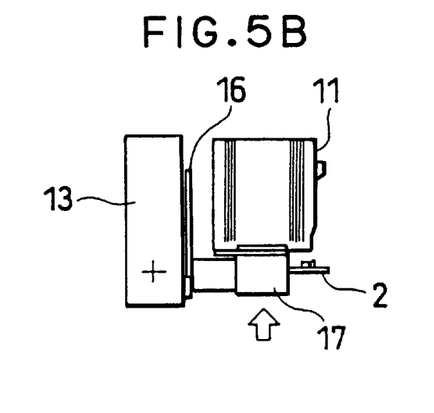
Figure 6A:
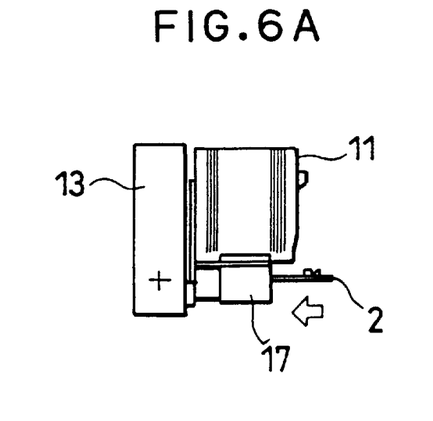
FIG. 6(A) and FIG. 6(B) are views showing part of the wafer cassette transfer operation carried out according to the preferred embodiments.
Figure 6B:
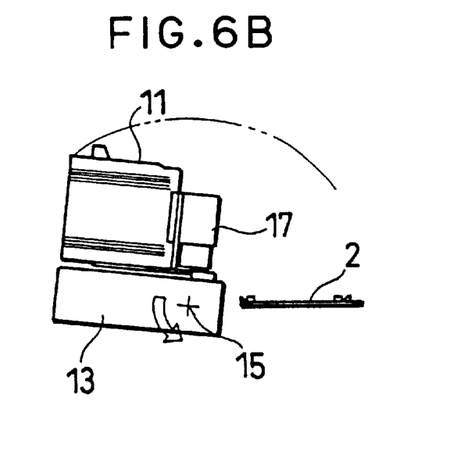

By the ascending movement of the cassette loader 13, the cassette receiver 17 receives and lifts the wafer cassettes 11 from the cassette transfer unit 2 (FIG. 5(B)). Thereafter, the cassette receiver 17 is retreated with respect to the cassette loader 13 to bring the wafer cassette 11 into contact with the cassette transfer plate 16 (FIG. 6(A)). Next, the cassette loader 13 is rotated by an angle smaller than 90° followed by causing the wafer cassette 11 to be inclined by an angle smaller than 45° (preferably smaller than 5° due to the spatial restrictions within the apparatus) with respect to a horizontal plane and keeping the wafer cassette 11 inclined by means of the cassette transfer plate 16 (FIG. 6(B)). It should be noted that the wafer cassette 11 is inclined so as to prevent the wafer 12 from being positionally displaced with respect to the wafer cassette 11 or falling off therefrom.

Figure 7A:
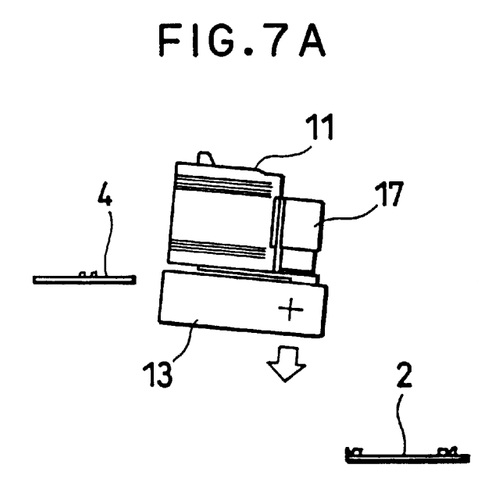
FIG. 7(A) and FIG. 7(B) are views showing part of the wafer cassette transfer operation carried out according to the preferred embodiments.
Figure 7B:
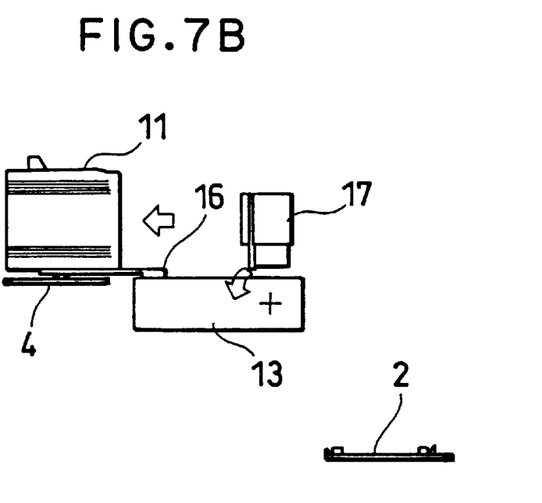
Figure 8:
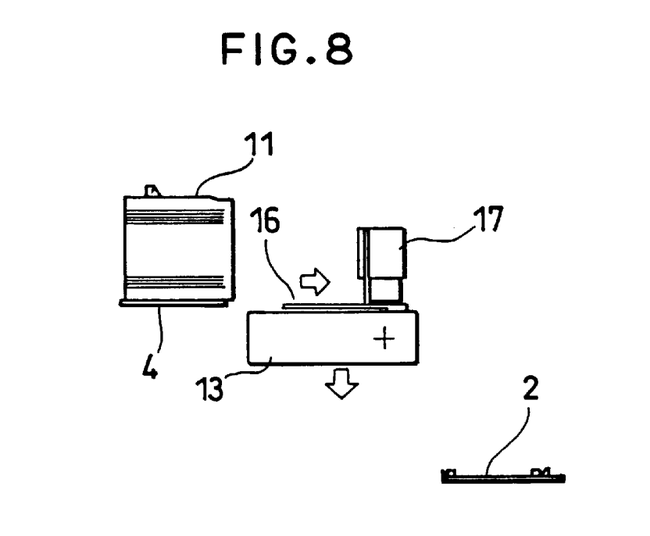
FIG. 8 is a view illustrating part of the wafer cassette transfer operation carried out according to the preferred embodiments.

Further, the cassette loader 13 is ascended and moved in a horizontal direction to make the wafer cassette 11 confront the cassette shelf to be transferred to (FIG. 7(A)). The cassette loader 13 is further rotated and the cassette transfer plate 16 is brought into a horizontal position. The cassette transfer plate 16 is then advanced, and the wafer cassette 11 is moved onto the cassette shelf (FIG. 7(B)). Then, the cassette loader 13 is descended. Finally, the cassette transfer plate 16 is retreated to thereby complete the transfer operation (FIG. 8).

The above-described operation is repeated to achieve the transfer of the wafer cassette 11 from the cassette transfer unit 2 to the cassette storage 4 and then to the buffer storage 5. In regard to the transfer operation of the wafer cassette 11 between the cassette storage 4 and the buffer storage 5, the 90° rotating operation of the cassette loader 13 is omitted since there is no change in the posture of the wafer cassette 11. The transfer between the cassette storage 4 and the buffer storage 5 is also effected while the wafer cassette 11 is inclined so as to avoid the positional displacement of the wafer.

It should be noted that the operation to transport the wafer cassette 11' for the dummy wafers loaded on the preliminary cassette shelf 30 to the cassette storage 4 is the same as the above-described operation for transporting the wafer cassette 11 of the cassette transfer unit 2 to the cassette storage 4 and the buffer storage 5.

Figure 4A:
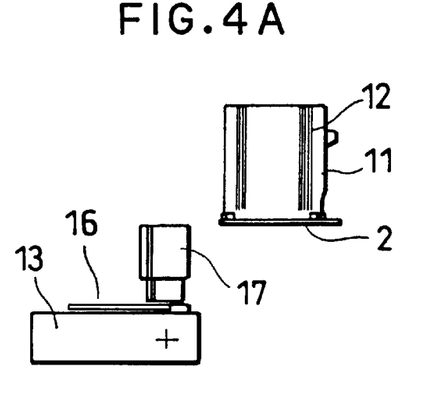
FIG. 4(A) and FIG. 4(B) are views showing part of the wafer cassette transfer operation carried out according to the preferred embodiments.
Figure 4B:
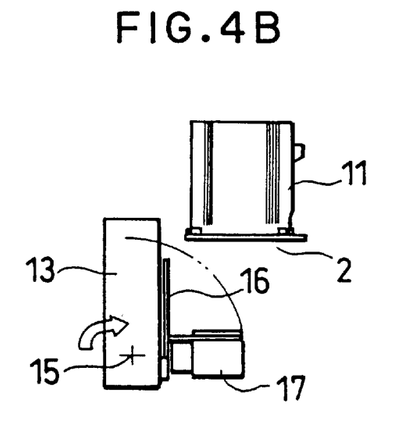

Now, the cassette loader 13 is rotated about the horizontal axial center 15 by 90° and the cassette receiver 17 is caused to enter the underside of the preliminary cassette shelf 30 (FIG. 4(A) and FIG. 4(B)). Then, the cassette receiver 17 is advanced relative to the cassette loader 13, whereafter the cassette loader 13 is ascended.

By the ascending movement of the cassette loader 13, the cassette receiver 17 receives and lifts the wafer cassette 11' from the preliminary cassette shelf 30 (FIG. 5(B)). Then, the cassette receiver 17 is retreated relative to the cassette loader 13 to bring the wafer cassette 11' into contact with cassette transfer plate 16 (FIG. 6(A)). Thereafter, the cassette loader 13 is rotated by an angle smaller than 90°, whereafter the wafer cassette 11' is inclined and retained by the cassette transfer plate 16 (FIG. 6(B)). The wafer cassette 11' should be inclined so as to prevent the wafer 12 from being displaced relative to the wafer cassette 11' and falling off therefrom.

Next, the cassette loader 13 is ascended and moved horizontally. Thereafter, the wafer cassette 11' is brought to confront the cassette shelf to be loaded on (FIG. 7(A)). The cassette loader 13 is further rotated, and the cassette transfer plate 16 is brought into a horizontal position. The cassette transfer plate 16 is advanced, and the wafer cassette 11' is moved onto the cassette shelf of the cassette storage 4 (FIG. 7(B)). The cassette loader 13 is then descended. Lastly, the cassette transfer plate 16 is retreated, whereby completing the transfer operation of the wafer cassette 11' (FIG. 8).

Upon completion of the treatment of the wafer in the reaction furnace 7, the wafer as a final product, monitor wafer and dummy wafer are loaded from the boat 8 onto the wafer cassette separately by the wafer transfer device 10.

The wafer cassette 11 loading the wafer and monitor wafer is transported from the cassette storage 4 to the cassette transfer unit 2 by the cassette transfer device 3 and then to the outside of the apparatus by an external transport unit not shown. Following backwardly the above-described transfer operation as shown in FIG. 4–FIG. 8, the wafer cassette 11' with the dummy wafer loaded thereon is transferred back onto the preliminary cassette shelf 30 after it is turned from a horizontal position into an upwardly-oriented position or posture.

After treatment of the wafer, since the wafer cassette 11' is accommodated by the preliminary cassette shelf 30 in an upwardly-oriented position, the position of the wafer relative to the wafer cassette is modified. Consequently, no positional displacement will arise with respect to the wafer cassette even when the dummy wafer is used repeatedly.

Further, since the wafer cassette 11' is accommodated by the preliminary cassette shelf 30, the cassette storage 4 and the buffer storage 5 are provided with extra room, whereby the semiconductor fabricating apparatus is rendered to have increased capacity to accommodate wafer cassette. The preliminary cassette shelf 30 may not necessarily be positioned to confront the buffer storage 5 and may be positioned at any place where the transfer by the cassette transfer device 3 is possible. Parts of the cassette storage 4 and the buffer storage 5 may also be constructed to allow loading of the wafer cassette 11 in upwardly-oriented position. In order for the wafer cassette 11 to be loaded on the cassette storage 4 and the buffer storage 5 in upwardly-oriented position, the cassette transfer device 13 is rotated in a horizontal plane by 180°, followed by the above-described operation.

Next, operation to modify the positional displacement of the wafer in the wafer cassette 11 accommodated within the cassette storage 4 and the buffer storage 5 will be explained hereafter. Modification of the positional displacement of the wafer with respect to the wafer cassette in a case where the wafer cassette accommodating the dummy wafer, etc. is not loaded on the preliminary cassette shelf 30 is effected by the cassette transfer device 3.

Operation of the cassette transfer device 3 with respect to the cassette storage 4 and the buffer storage 5 is performed to transfer the wafer cassette 11 accommodated therein onto the cassette transfer plate 16 so as to take the cassette out therefrom. After the wafer cassette 11 is brought into contact with the cassette receiver 17, the cassette loader 13 is rotated by 90° to cause the wafer cassette 11 to be upwardly oriented. By the introduction of the step of turning the wafer cassette to have an upwardly-oriented position, the positional displacement of the wafer relative to the wafer cassette 11 is modified.

Thereafter, the cassette loader 13 is counter-rotated by 90° and the cassette transfer plate 16 is caused to advance toward the cassette storage 4 and the buffer storage 5, whereafter the wafer cassette 11 is returned to the cassette storage 4 and the buffer storage 5 (see FIG. 6(A)–FIG. 7(B)).

As mentioned above, the cleanliness within the housing 1 significantly affects the results of the wafer treatment. One way to improve such cleanliness would be to provide a flow of uniform clean air within the housing 1 to thereby prevent undesired particles from remaining therein.

In the described embodiment, a treatment space 33 for accommodating the cassette storage 4 and the boat 8 is separated from a transfer space 34 for accommodating the cassette transfer unit 2, cassette transfer device 3 and the buffer storage 5. Arrangements are also made to allow flowing of uniform clean air through both the treatment space 33 and transfer space 34 to thereby prevent outside air from directly flowing into the treatment space 33, thus improving the cleanliness of the treatment space 33.

Referring back to FIG. 1 and FIG. 2, flow of clean air will now be described. Outside air aspirated into the housing 1 from a side thereof by means of the clean unit 31 forms a flow of clean air 32 flowing horizontally across the treatment space 33, which will be exhausted through a duct not shown. The clean unit 6 sends out clean air horizontally against the buffer storage 5. The flow of clean air 35 passing through the buffer storage 5 is directed downwardly at the front side of the housing 1, suctioned by the clean unit 25 and further directed to flow into the underside of the cassette transfer unit 2.

Figure 2:
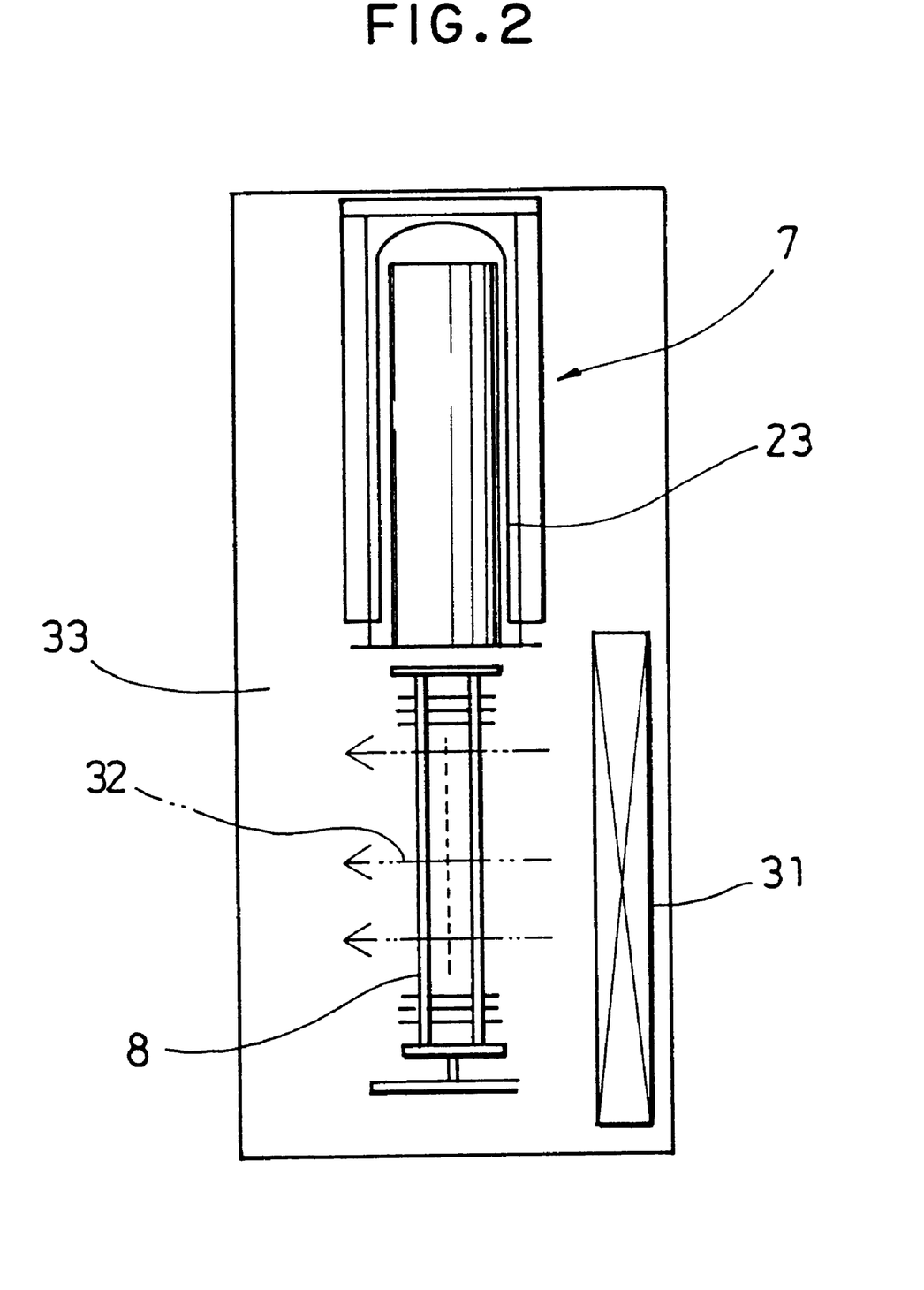
FIG. 2 is a schematic rear elevational view of the embodiment according to the present invention.

The flow of clean air 32 is parallel with the wafer held by the boat 8. The flow of clean air 35 is held parallel with the respective wafers accommodated in the buffer storage 5 and the preliminary cassette shelf 30. As a result, the flow of clean air will not be interrupted by the wafers, thus avoiding the remaining of the clean air within the apparatus and enabling maintenance of the desired cleanliness.

As explained above, the clean air flow through the apparatus should not be interrupted so that the required cleanliness can be maintained. Therefore, in the embodiment shown in FIG. 1, the wafer cassettes 11 are arranged such that at least one wafer cassette 11 of the cassette storage 4, which is accessed by the wafer transfer device 10, is laid in such a manner as to load the wafer thereon horizontally and the other wafer cassettes of the cassette storage 4 may be laid to load the wafers thereon in parallel relations with the flow of clean air 32, the wafer cassettes not accessed by the wafer transfer device 10 being arranged vertically. In the preliminary cassette shelves 30, the wafer within the wafer cassette 11' may be arranged parallel with the flow of clean air 35.

Hence, the wafer as loaded on the wafer cassette 11' is arranged vertically.

Figure 3:
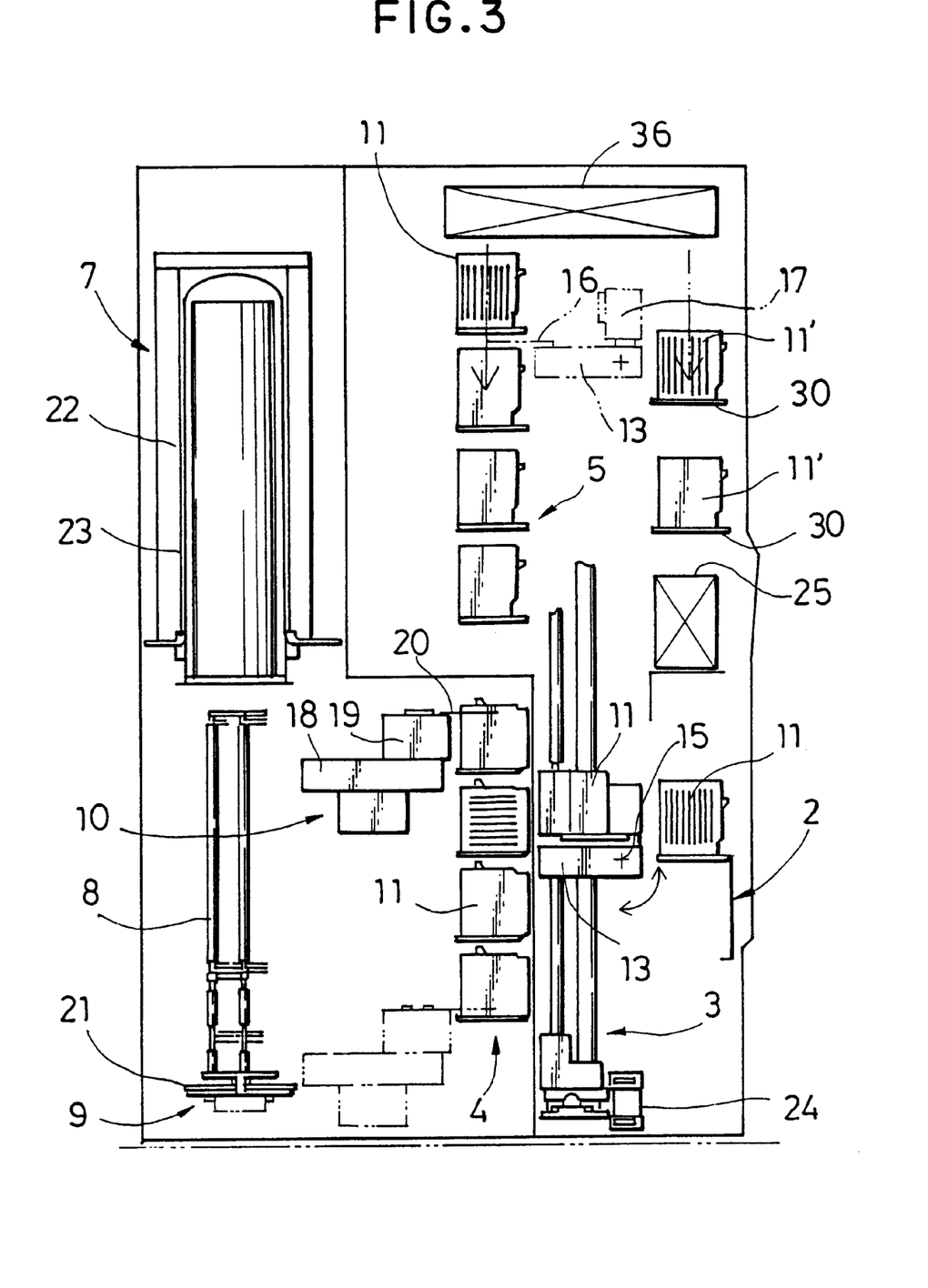
FIG. 3 is a schematic side elevational view of another preferred embodiment according to the present invention.

FIG. 3 shows an alteration in which the clean unit 36 is disposed immediately above the buffer storage 5 and the preliminary cassette shelf 30. In this instance, a flow of clean air provided by the clean unit 36 flows vertically and is directed parallel with the wafer in the cassette accommodated within the buffer storage 5 and with the wafer in the wafer cassette 11' loaded on the preliminary cassette shelves 30, thus avoiding the stagnation of the clean air around the wafer.

As described above, since it is required to avoid interrupting the flow of clean air through the apparatus so as to maintain the desired cleanliness, the wafer cassettes of the embodiment shown in FIG. 3 are arranged in a manner similar to that shown in FIG. 1 with respect to the cassette storage 4 and the preliminary cassette shelves 30. In regard to the buffer storage 5, the flow of clean air may be directed parallel with the surfaces of the wafers, then the wafer cassettes 11 are accommodated in vertical orientation with the surfaces of the wafers also positioned vertically.

As thus far explained in detail, according to the present invention, it becomes possible to modify the positional displacement of the dummy wafers relative to the wafer cassettes, which is likely to occur during repeated uses of the dummy wafers. As a result, it becomes possible to avoid the accumulation of such displacement and hence the damaging of the wafers and down-fall of the boat resulting from such displacement. This further enables avoidance of the stoppage of the semiconductor fabricating apparatus, thus improving the serviceability ratio of the apparatus. By the inventive arrangement, it also becomes possible to provide a larger space in the apparatus for accommodating wafer cassettes, thus increasing the rate of effective use of the internal space of the apparatus. Additionally, since an uniform flow of clean air is formed within the semiconductor fabricating apparatus, the cleanliness within the apparatus is increased, whereby the quality of the treated products is improved.

What is claimed is:

1. A semiconductor fabricating apparatus for use with a plurality of wafer cassettes, each of which can carry at least one wafer, said apparatus comprising:

a reaction furnace for treatment of a plurality of wafers;

a holder for holding said plurality of wafers, said holder capable of being loaded into said reaction furnace;

a storage area having a plurality of wafer cassette shelves, which are capable of storing at least one wafer cassette;

a wafer transfer device for transferring at least one wafer between said holder and said storage area such that said wafer is in a substantially horizontal direction; and a cassette transfer unit capable of receiving at least one wafer cassette from outside said apparatus; and a cassette transfer device capable of transferring at least one wafer cassette between said cassette transfer unit and said storage area, wherein said cassette transfer device is capable of situating at least one wafer cassette on one of said plurality of wafer cassette shelves in the storage area such that the wafers therein are substantially horizontal, and situating at least one other wafer cassette on another one of said plurality of wafer cassette shelves in the storage area excluding said cassette transfer unit such that the wafers therein are substantially vertical so that clean air is permitted to flow past the vertical wafers.

2. The semiconductor fabricating apparatus according to claim 1, wherein said another one of said plurality of wafer cassette shelves that stores wafers in a substantially vertical position is provided above said cassette transfer unit.

3. The semiconductor fabricating apparatus according to claim 1, wherein said cassette transfer device includes a cassette loader capable of changing the orientations of said plurality of wafer cassettes.

4. The semiconductor fabricating apparatus according to claim 1, wherein said plurality of wafer cassettes are within reach of said cassette loader.

5. The semiconductor fabricating apparatus according to claim 1, wherein said cassette transfer device includes a cassette loader capable of transferring said wafer cassette in inclined position.

6. The semiconductor fabricating apparatus according to claim 1, wherein said storage area further comprises:

a cassette storage area; and a buffer storage area, said buffer storage area being disposed above said cassette storage area.

7. The semiconductor fabricating apparatus according to claim 1, further comprising:

a clean unit for forming said flow of clean air; and a plurality of other cassette shelves provided above said cassette transfer unit, wherein said storage area includes:

a cassette storage area; and a buffer storage area, said buffer storage area being disposed above said cassette storage area, wherein said clean unit is provided in opposed relationship with said buffer storage area for forming a flow of clean air through said buffer storage area, and wherein said plurality of other cassette shelves are provided downstream of said clean air flow.

8. The semiconductor fabricating apparatus according to claim 7, wherein said plurality of other cassettes shelves store said wafer cassettes in substantially vertical positions.

9. The semiconductor fabricating apparatus according to claim 1, further comprising a clean unit, wherein said clean unit provides said flow of clean air in a substantially vertical direction.

10. The semiconductor fabricating apparatus according to claim 1, further comprising a clean unit for forming said flow of clean air, wherein said wafer cassettes are held in such manner that the wafers are parallel to said flow of clean air.

* * * * *